United States Patent
Alshuhail et al.

(10) Patent No.: US 11,349,435 B1
(45) Date of Patent: May 31, 2022

(54) CURRENT-MODE SQUARE WAVE OSCILLATOR

(71) Applicants: SAUDI ARABIAN OIL COMPANY, Dhahran (SA); KING FAHD UNIVERSITY OF PETROLEUM & MINERALS, Dhahran (SA)

(72) Inventors: Abdulrahman Alshuhail, Dhahran (SA); Hussain Alzaher, Dhahran (SA)

(73) Assignees: SAUDI ARABIAN OIL COMPANY, Dhahran (SA); KING FAHD UNIVERSITY OF PETROLEUM & MINERALS, Dhahran (SA)

( * ) Notice: Subject to any disclaimer, the term of this patent is extended or adjusted under 35 U.S.C. 154(b) by 0 days.

(21) Appl. No.: 17/191,301

(22) Filed: Mar. 3, 2021

(51) Int. Cl.
    *H03B 5/04* (2006.01)
    *H03B 5/24* (2006.01)
    *H03K 3/011* (2006.01)

(52) U.S. Cl.
    CPC ............ *H03B 5/24* (2013.01); *H03B 5/04* (2013.01); *H03K 3/011* (2013.01); *H03B 2200/0082* (2013.01)

(58) Field of Classification Search
    CPC ... H03B 5/04; H03B 5/20; H03B 5/24; H03B 2200/0082; H03K 3/011; H03K 3/0231
    USPC .................................................. 331/111, 143
    See application file for complete search history.

(56) References Cited

U.S. PATENT DOCUMENTS

| | | | |
|---|---|---|---|
| 3,933,046 A * | 1/1976 | Ebrecht | G01K 7/245 374/170 |
| 3,984,703 A | 10/1976 | Jorgensen | |
| 4,063,119 A | 12/1977 | Odell et al. | |
| 4,359,649 A | 11/1982 | Mundel | |
| 4,490,627 A | 12/1984 | Moench et al. | |
| 4,571,504 A | 2/1986 | Iwamoto et al. | |
| 4,694,198 A | 9/1987 | Umeki | |
| 4,719,367 A | 1/1988 | Denda | |
| 4,883,975 A | 11/1989 | Enomoto et al. | |
| 5,327,020 A | 7/1994 | Ikeda | |
| 5,438,292 A | 8/1995 | Tadokoro | |
| 5,689,199 A | 11/1997 | Erckert | |
| 5,874,844 A | 2/1999 | Shin | |

(Continued)

FOREIGN PATENT DOCUMENTS

| JP | H09321587 A | 12/1997 |
|---|---|---|
| WO | 2019028595 A1 | 2/2019 |

OTHER PUBLICATIONS

Alzaher, Hussain A., "Novel Schmitt Trigger and Square-Wave Generator Using Single Current Amplifier", IEEE Access, Dec. 2019, vol. 7, p. 186175-186181 (7 pages).

(Continued)

*Primary Examiner* — Levi Gannon

(74) *Attorney, Agent, or Firm* — Osha Bergman Watanabe & Burton LLP

(57) ABSTRACT

A square wave oscillator includes a Schmitt Trigger with a first output that outputs a first output current, a capacitor connected to the first output of the Schmitt Trigger, and a resistor that connects the capacitor to an input of the Schmitt Trigger to form a closed-loop negative feedback. The closed-loop negative feedback sustains an oscillation of the square wave oscillator and causes a frequency and an amplitude of the oscillation to be independent of a supply voltage of the Schmitt Trigger.

15 Claims, 8 Drawing Sheets

(56) References Cited

U.S. PATENT DOCUMENTS

| | | | |
|---|---|---|---|
| 6,791,427 B1* | 9/2004 | Nyce | H03K 3/0231 |
| | | | 331/111 |
| 6,825,735 B2 | 11/2004 | Chung | |
| 7,529,317 B2 | 5/2009 | Chien et al. | |
| 7,847,633 B2 | 12/2010 | Kinget | |
| 8,044,735 B2* | 10/2011 | Gaede | H03L 1/022 |
| | | | 331/143 |
| 8,618,887 B2* | 12/2013 | Dickey | H03K 3/84 |
| | | | 331/47 |
| 2019/0158072 A1 | 5/2019 | Tornila | |

OTHER PUBLICATIONS

Biolek, Dalibor and Viera Biolková, "Current-Mode CDTA-Based Comparators", In the 13th Electronic Devices and Systems 2006 IMAPS CS/SK International Conference, EDS2006, 2006, pp. 6-10 (5 pages).

Das, Rupam and Khushi Banerjee, "A Simple Current Mode Schmitt Trigger Circuit Based on Single CCDDCCTA without Employing Any Passive Components", International Journal of Innovative and Emerging Research in Engineering, vol. 3, Issue 8, 2016, pp. 17-21 (5 pages).

Das, Rupam et al., "Current Mode Schmitt Trigger Circuit Design Using Only Single CCCDTA", International Journal of Advanced Engineering and Management, vol. 2, No. 9, 2017, pp. 219-222 (4 pages).

Hirunporm, Jirawat and Montree Siripruchyanun, "An Independently/Electronically Controllable Schmitt Trigger Using only Single VDGA", 17th International Conference on Electrical Engineering/Electronics, Computer, Telecommunications and Information Technology, IEEE, 2020, pp. 118-121 (4 pages).

Kim, K. et al., "OTA-R Schmitt trigger with independently controllable threshold and output voltage levels", Electronics Letters, IEEE, vol. 13, No. 13, Jun. 1997, pp. 1103-1105 (3 pages).

Kumar, Atul and Bhartendu Chaturvedi, "Novel Electronically Controlled Current-Mode Schmitt Trigger Based on Single Active Element", International Journal of Electronics and Communications, Aug. 2017, doi: http://dx.doi.org/10.1016/j.aeue.2017.08.2017 (21 pages).

Lo, Yu-Kang et al., "Current-input OTRA Schmitt trigger with dual hysteresis modes", International Journal of Circuit Theory and Applications, Wiley Online Library, John Wiley & Sons, Ltd., vol. 38, Feb. 2009, pp. 739-746 (8 pages).

Mohammad, Umar et al., "A novel square wave generator based on the translinear circuit scheme of second generation current controlled current conveyor—CCCII", SN Applied Sciences, Springer Nature Switzerland AG, vol. 1, No. 587, May 2019 (14 pages).

Moradi, A. and M. Sawan, "Differential rail-to-rail voltage-controlled quadrature ring oscillator for low-power implantable transceivers", Electronics Letters, IEEE, vol. 50, No. 22, Oct. 2014, pp. 1568-1570 (2 pages).

Sedra, Adel S. et al., "17.4 Bistable Multivibrators", Microelectronic Circuits, 8th Edition, Oxford University Press, Nov. 2019, pp. 1355-1358 (4 pages).

Sedra, Adel S. et al., "17.5 Operation of the Astable Multivibrator", Microelectronic Circuits, 8th Edition, Oxford University Press, Nov. 2019, pp. 1364-1365 (3 pages).

Silapan, Phamom and Montree Siripruchyanun, "A Simple Current-mode Schmitt Trigger Employing Only Single MO-CTTA", 6th Annual International Conference on Electrical Engineering/Electronics, Computer, Telecommunications and Information Technology, IEEE, May 2009, pp. 556-559 (4 pages).

Soni, Gauri Shankar and Mohd. Samar Ansari, "Current-Mode Electronically-Tuneable Schmitt Trigger using Single 65nm ±0.75V CMOS CDTA", International Conference on Signal Propagation and Computer Technology, IEEE, 2014, pp. 137-141 (5 pages).

Tamnupan, Wuttipong and Varakorn Kasemsuwan, "A Low-Voltage Low-Power Current-Mode Differential Adjustable Schmitt Trigger", 9th International Conference on Electrical Engineering/Electronics, Computer, Telecommunications and Information Technology, IEEE, May 2012 (4 pages).

Zhang, Yudong et al., "A 0.35-0.5-V 18-152 MHz Digitally Controlled Relaxation Oscillator with Adaptive Threshold Calibration in 65-nm CMOS", IEEE Transactions on Circuits and Systems—II: Express Briefs, vol. 62, No. 8, Aug. 2015, pp. 736-740 (5 pages).

* cited by examiner

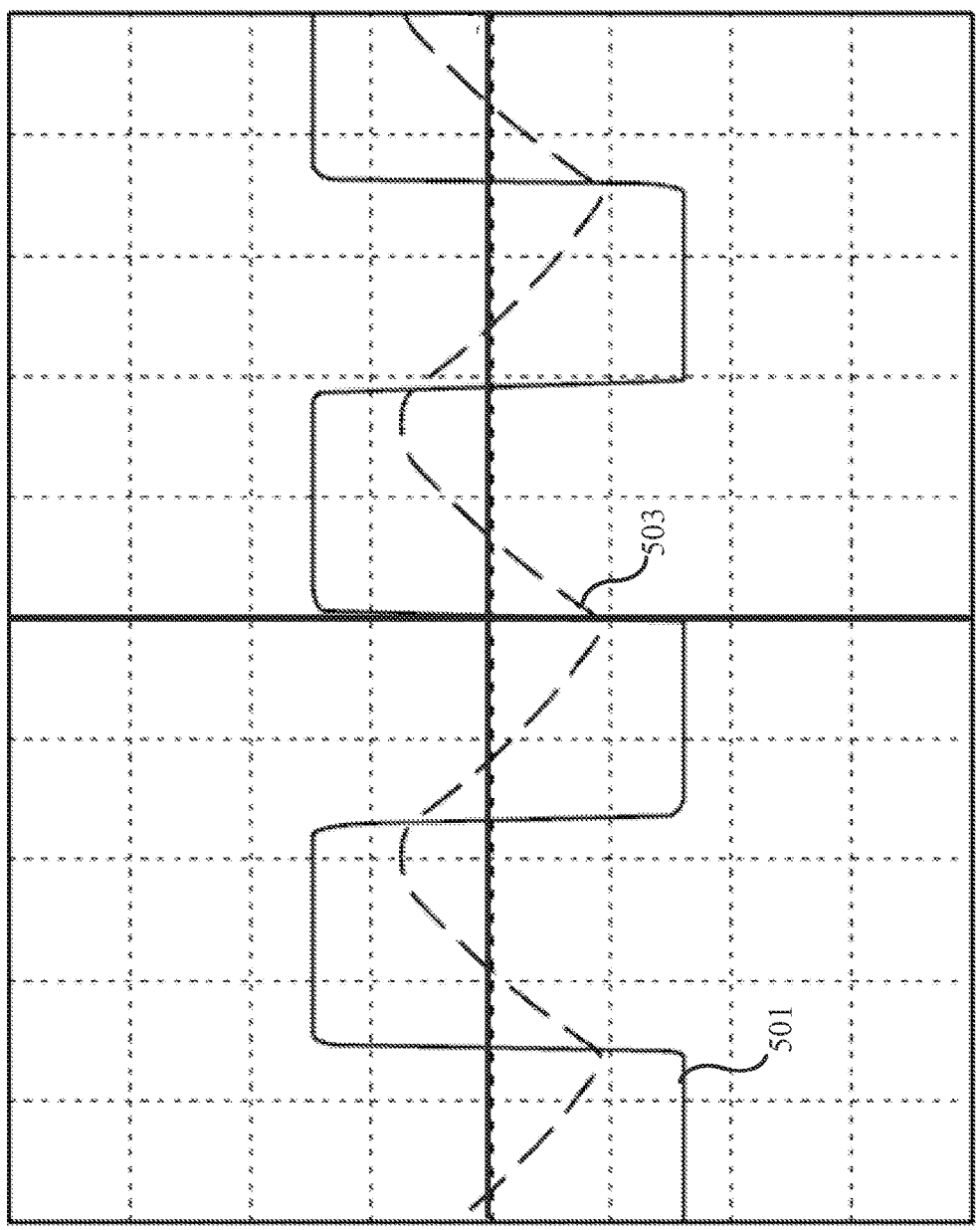

CURRENT-MODE SQUARE WAVE OSCILLATOR

BACKGROUND

Square wave generators based on ring oscillators can operate at high speed, but the oscillation amplitude and frequency are highly dependent on the supply voltage and transistors parameters. Such oscillators also suffer from start-up problems at low supply voltages (e.g., under 1V). In particular, it is difficult to provide sufficient gains at low supply voltages to meet the initial oscillation conditions. Other types of square wave generators based on operational amplifiers also exist. Although these types of square wave generators are more impermeable to process variations, their voltage mode operation inherently results in a supply-dependent output amplitude and hysteresis.

On the other hand, current-mode Schmitt Trigger based square wave generators using Current-Differencing Transconductance Amplifiers (CDTA) or current amplifiers have outputs that are independent of the supply voltage and transistors parameters. However, such types of square wave generators require using larger numbers of passive components (e.g., resistors) to adjust the oscillation frequency of the square wave output, which make them less attractive for low power and low voltage applications.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In general, one or more embodiments disclosed herein are directed to a square wave oscillator comprising: a Schmitt Trigger with a first output that outputs a first output current; a capacitor connected to the first output of the Schmitt Trigger; and a resistor that connects the capacitor to an input of the Schmitt Trigger to form a closed-loop negative feedback. The closed-loop negative feedback sustains an oscillation of the square wave oscillator; and causes a frequency and an amplitude of the oscillation to be independent of a supply voltage of the Schmitt Trigger.

Other aspects and advantages of the claimed subject matter will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency.

FIGS. 5A-5C show graphs in accordance with one or more embodiments.

DETAILED DESCRIPTION

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments disclosed herein provide a current-mode square wave generator applying a Schmitt Trigger utilizing complementary metal-oxide-semiconductor (CMOS) technology. Such a configuration advantageously provides a square wave output whose amplitude and frequency of oscillation are independent of supply voltage and transistor parameters. Additionally, an oscillation frequency of the square wave output can be electronically controlled (i.e., tuned) using a single DC current (e.g., a biasing current) rather than being adjusted by a large number of passive components. This advantageously allows the current-mode square wave generator of one or embodiments to be compatible with low power and low voltage devices and applications. In one or more embodiments, bipolar junction transistors (BJTs) may be used in place of CMOSs.

Figure 1:
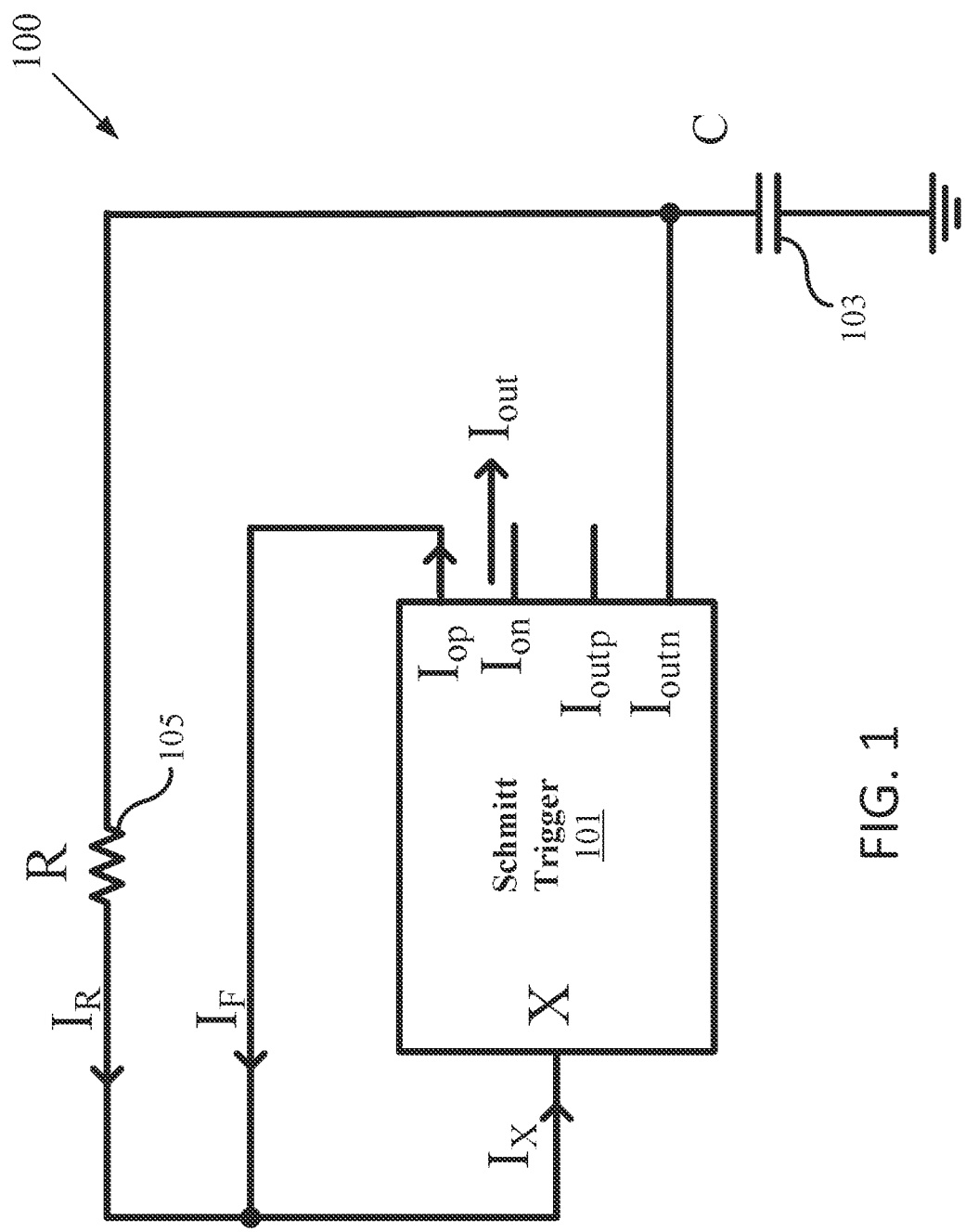
FIG. 1 shows a diagram in accordance with one or more embodiments.

FIG. 1 shows a circuit diagram of a square wave generator (100) (i.e., a square wave oscillator) in accordance with one or more embodiments. The square wave generator (100) includes a Schmitt Trigger (101), a capacitor (103), and a resistor (105). Each of these components will be discussed in more detail below.

As shown in FIG. 1, in one or more embodiments, the Schmitt Trigger (101) includes an input (X) that receives an input current signal ($I_x$). The Schmitt Trigger (101) also includes multiple outputs including an output amplitude control stage non-inverting output ($I_{op}$), an output amplitude control stage inverting output ($I_{on}$), an hysteresis control stage non-inverting output ($I_{outp}$), and an hysteresis control stage inverting output ($I_{outn}$).

Each of these outputs ($I_{op}$, $I_{on}$, $I_{outp}$, $I_{outn}$) generates an output current. Additionally, the output amplitude control stage non-inverting output ($I_{op}$) and output amplitude control stage inverting output ($I_{on}$) form a first pair of matching differential outputs while the hysteresis control stage non-inverting output ($I_{outp}$) and hysteresis control stage inverting output ($I_{outn}$) form a second pair of matching differential outputs. In other words, the output current at the output amplitude control stage inverting output ($I_{on}$) in an inverse of the output current at the output amplitude control stage non-inverting output ($I_{op}$). Similarly, the output current at the hysteresis control stage inverting output ($I_{outn}$) is an inverse of the output current at the hysteresis control stage non-inverting output ($I_{outp}$).

In one or more embodiments, the output current from the output amplitude control stage non-inverting output ($I_{op}$) is fed back to the input (X) to create a regeneration feedback loop carrying a feedback current ($I_F$). The regeneration feedback loop is a positive feedback loop that realizes (i.e., activates) the Schmitt Trigger (101). The output signal from the output amplitude control stage inverting output ($I_{on}$) is used as the square wave output ($I_{out}$) of the square wave generator (100).

In one or more embodiments and as further shown in FIG. 1, the square wave generator (100) includes a closed-loop negative feedback configuration that automatically triggers (i.e., starts) the generation of a square wave output ($I_{out}$). In other words, the closed-loop negative feedback configuration starts and sustains the oscillation of the square wave generator (100).

This closed-loop negative feedback configuration is formed by first connecting one end of the capacitor (103) to the hysteresis control stage inverting output ($I_{outn}$). The other end of the capacitor (103) is grounded such that the capacitor (103). As a result, the capacitor becomes (103) a timing capacitor and may be used to adjust a frequency of the square wave output ($I_{out}$). The resistor (105) is then connected between the hysteresis control stage inverting output ($I_{outn}$) and the input (X). As a result, the resistor (103) becomes a feedback resistor that changes the voltage at the grounded capacitor (103) to a feedback resistor current ($I_R$). The feedback resistor current ($I_R$) is fed back into the input (X) along with the feedback current ($I_F$).

In one or more embodiments, the capacitor (103) may be any type of capacitor (e.g., electrolytic, mica, film, non-polarized, ceramic, a surface mount technology (SMT) capacitor etc.) of any value (e.g., from a few picofarads to a few millifarads) that is capable of charging and discharging. For example, the capacitor (103) is a ceramic capacitor with a capacitance of 25 picofarads (pF). The resistor 105 may be any type of resistor (e.g., carbon composition resistor, film resistor, cement resistor, wire-wound resistor, semiconductor resistor, a potentiometer, an SMT resistor, etc.) and can be of any value (e.g., from a few hundred ohms to a few mega ohms). For example, the resistor (105) is a film resistor with a resistance of 40 kiloohms (kΩ).

Furthermore, the square wave generator (100) may include only a single capacitor (103) and only a single resistor (105). This advantageously reduces the number of required passive components (e.g., resistors), which makes square wave generator (100) more compatible and better suited for low power and low voltage devices and applications. However, the square wave generator (100) is not limited to such a configuration and may include multiple ones of the capacitor (103) and resistor (105). For example, one of ordinary skill in the art would appreciate that any circuit designed with two (or more) resistors in the closed-loop negative feedback configuration simply as a means to reach the above example resistance of 40 kiloohms (kΩ) would meet the square wave generator (100) of one or more embodiments.

Additional details of the Schmitt Trigger (e.g., a full circuit diagram of the Schmitt Trigger) will be discussed below in reference to FIGS. 2A-2B.

Figure 2A:
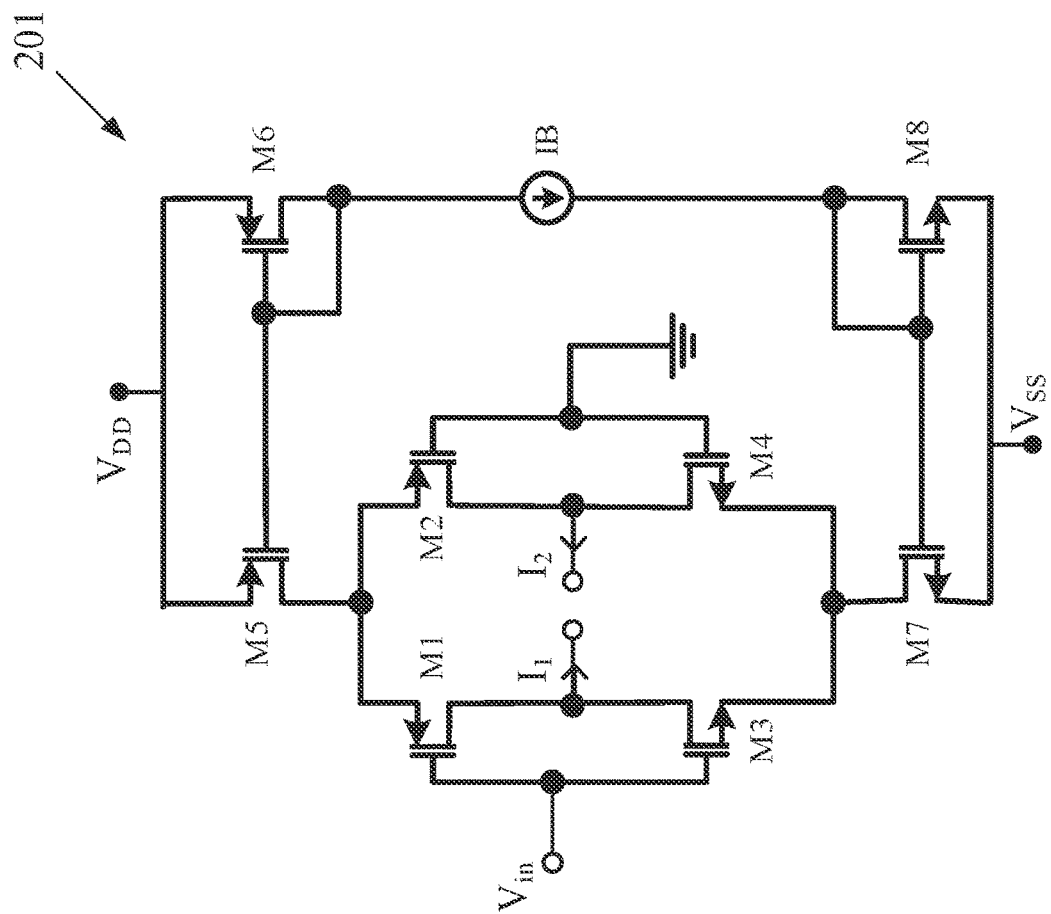
FIG. 2A shows a diagram in accordance with one or more embodiments.

FIG. 2A shows a circuit diagram of a single current output stage (COS) (201) of the Schmitt Trigger (101), in accordance with one or more embodiments of the invention.

As shown in FIG. 2A, the COS (201) includes only active components (e.g., semiconductors and transistors) without any passive components (e.g., resistors). In particular, the COS (201) includes a plurality of CMOSs (M1-M8) powered by supply voltages (VDD, VSS). The plurality of CMOSs (M1-M8) includes four (4) P-channel CMOSs (M1, M2, M5, M6) and four (4) N-channel CMOSs (M3, M4, M7, M8).

One of ordinary skill in the art would appreciate that in the field of electronics, active components (e.g., transistors, CMOSs, rectifiers, amplifier, etc.) are parts (e.g., components) of a circuit that rely on an external power source to control or modify electrical signals. On the other hand, passive components (e.g., resistors, capacitors, transformers, diodes, etc.) are parts of a circuit that do not need an external power source to function.

As further shown in FIG. 1, the COS (201) includes an input (Vin) between the drains of CMOSs M1 and M3 while the drains of CMOSs M2 and M4 are connected to ground. The positive supply voltage (VDD) is supplied to the sources of CMOSs M5 and M6 while the negative supply voltage (VSS) is supplied to the sources of CMOSs M7 and M8. This configuration of the COS (201) generates two output current signals (herein referred to as "output current") ($I_1$ and $I_2$) when the input (Vin) is supplied with a voltage. The two output current signals ($I_1$, $I_2$) are differential signals where $I_1 = -I_2$. In other words, independently, the COS (201) functions as a voltage-to-current convertor when the input (Vin) is supplied with a voltage.

In one or more embodiments, a biasing current ($I_B$) is generated between the drains of CMOSs M6 and M8 to cause the transistors to work within a pinch off region of the transistors. The COS (201) also has a high gain value (e.g., a gain of approximately 60 μA/V for a biasing current of 10 μA) when converting the input voltage supplied at the input (Vin) into the output currents ($I_1$, $I_2$). Additionally, the supply voltages (VDD and VSS) of the COS may be set within a range of ±0.5V to ±1.5V In one or more embodiments, each current output stage (COS) may be implemented using a CD4007UB CMOS dual complementary pair plus inverter integrated circuit (IC) chip. Each CD4007UB IC chip includes three (3) n-channel CMOSs and three (3) p-channel CMOSs. Additionally, any other types of existing CMOSs may be used to implement each COS. For example, any standard CMOSs and/or ICs housing multiple standard CMOSs may be used to implement one COS (201).

Figure 2B:
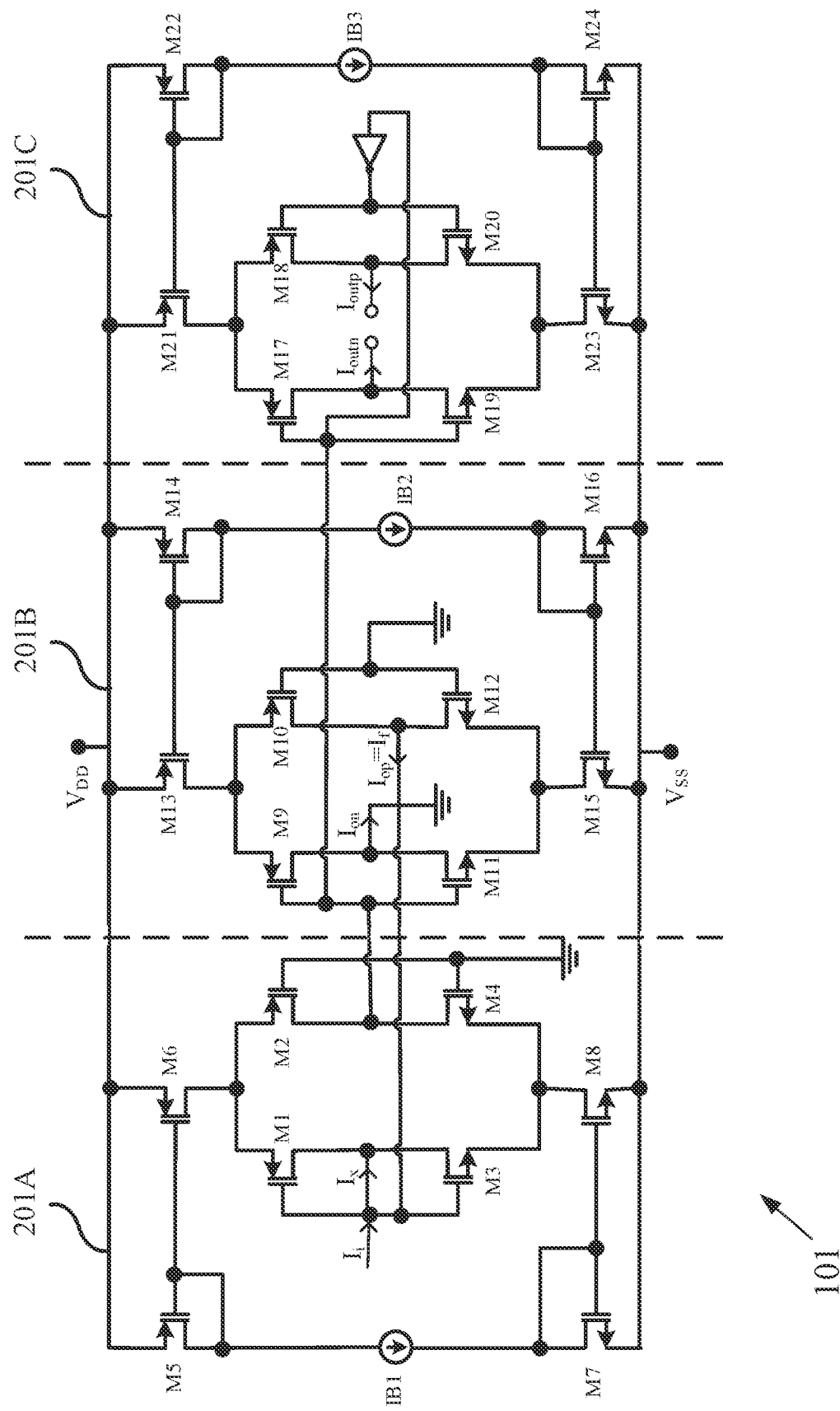
FIG. 2B shows a diagram in accordance with one or more embodiments.

FIG. 2B shows a detailed circuit diagram of the Schmitt Trigger (101) of one or more embodiments.

As shown in FIG. 2B, the current-based Schmitt Trigger (200) includes three (3) of the COS (201) shown in FIG. 1. Each of these COSs (201A, 201B, 201C) are connected to the same supply voltages (VDD and VSS). Each of these COSs (201A, 201B, 201C) also includes a respective biasing current ($I_{B1}$, $I_{B2}$, $I_{B3}$). Although the current-based Schmitt Trigger (101) in FIG. 2B is shown with three COSs (201), one of ordinary skill in the art would appreciate that more than three COSs (201) can be utilized to achieve the current-based Schmitt Trigger (101). Each of these COSs (201A, 201B, 201C) will now be discussed in more detail below.

In one or more embodiments, firstly, the COS (201A) will now be referred to as an input stage COS (201A). The input stage COS (201A) includes CMOSs M1-M8 and is configured as a high gain current-to-voltage convertor. That is, an input current signal is fed into input ($I_i$) to generate a large voltage signal (e.g., a gain of 3V/μA) between the drains of CMOSs M2 and M4 (i.e., to generate a high voltage signal at an output of the input stage COS (201A)).

In one or more embodiments, secondly, the COS (201B) will now be referred to as an output amplitude control COS (201B). The output amplitude control COS (201B) includes the CMOSs M9-M16 and is configured as a voltage-to-current convertor. The output amplitude control COS (201B) converts the voltage signal output from the input stage COS (201A) into balanced output signals ($I_{on}$ and $I_{op}$) where $I_{op}=-I_{on}$. In other words, lop is a non-inverting output current while $I_{on}$ is a complementary inverting output current.

A positive closed-loop feedback for the current-based Schmitt Trigger (101) is configured by shorting the non-inverting output ($I_{op}$) of the output amplitude control COS (201B) with the input ($I_i$) of the input stage COS (201A). This positive closed-loop feedback results in a feedback current ($I_f$) that flows in the direction of the input ($I_i$) of the input stage COS (201A). This positive closed-loop feedback also realizes (i.e., activates or forms) current-based Schmitt Trigger (101) circuit.

In one or more embodiments, thirdly, the COS (201C) will now be referred to as a hysteresis control COS (201C). The hysteresis control COS (201C) includes the CMOSs M17-M24 and, similar to the output amplitude control COS (201B), is configured as a voltage-to-current convertor. In particular, the hysteresis control COS (201C) converts the voltage signal output from the input stage COS (201A) into balanced output signals ($I_{outn}$ and $I_{outp}$) where $I_{outp}=-I_{outn}$. As seen in FIG. 2B, to ensure that the output signals ($I_{outn}$ and $I_{outp}$) are fully balanced (i.e., fully identical), a digital inverter is connected between the gates of CMOSs M17 and M19 of the hysteresis control COS (201C). In one or more embodiments, the digital inverter may be a CMOS invertor consisting of a p-channel CMOS connected to a n-channel CMOS. In particular, the gates of the two CMOSs are connected and provided with an input voltage or current while the drains of the two CMOSs are connected and provide an output of the CMOS invertor. Finally, the source of the p-channel CMOS is connected to the positive supple voltage (VDD) while the source of the n-channel CMOS is connected to ground.

As further shown in FIG. 2B, there is no feedback between the hysteresis control COS (201C) and the input stage COS (201A). Without such a feedback, the hysteresis control COS (201C) possess a large open-loop gain (e.g., an open-loop gain of 200 A/A) as a result of the gains of the input stage COS (201A) and output amplitude control COS (201B). As a result, the hysteresis control COS (201C) becomes a current-mode comparator able to generate the balanced output signals ($I_{outn}$ and $I_{outp}$).

In one or more embodiments, a current from the drains of CMOSs M9 and M11 of the output amplitude control COS (201B) saturates at a negative DC biasing current of the output amplitude control COS (201B). This DC biasing current of the output amplitude control COS (201B) will now be referred to as a second biasing current ($I_{B2}$) of the current-mode Schmitt Trigger (101). In this configuration $I_{on}=-I_{B2}$ to result in a positive input current ($I_X$) at the input stage COS (100A). Conversely, a current from drains of CMOSs M10 and M12 of the output amplitude control COS (201B) saturates at a positive DC current of the output amplitude control COS (201B) (i.e., $I_{op}=I_{B2}$).

Similarly, a current from drains of CMOSs M17 and M19 of the hysteresis control COS (201C) saturates at a negative DC biasing current of the hysteresis control COS (201C). This DC biasing current of the hysteresis control COS (201C) will now be referred to as a third biasing current ($I_{B3}$) of the current-mode Schmitt Trigger (101). In this configuration $I_{outn}=-I_{B3}$. Conversely, a current from drains of CMOSs M18 and M20 of the hysteresis control COS (100C) saturates at a positive DC current of the hysteresis control COS (201C) (i.e., $I_{outp}=I_{B3}$).

Finally, the input stage COS (201A) also includes a DC biasing current, which will now be referred to a first biasing current ($I_B$) of the current-mode Schmitt Trigger (101). In one or more embodiments, changing the first biasing current ($I_B$) of the current-mode Schmitt Trigger (101) is not required to generate a large hysteresis (e.g., 100 μA) in the current-mode Schmitt Trigger (101).

An operation of the current-mode Schmitt Trigger (101) as a whole will now be discussed. In one or more embodiments, assuming that the current-mode Schmitt Trigger (200) starts at a high state of $I_{on}=I_{B2}$ (i.e., $I_{op}=-I_{B2}$ and $I_X<0$), a value of $I_{outn}$ will remain at $I_{B3}$ until $I_X$ becomes positive (i.e., $I_X$ becomes greater than $I_{B2}$). As $I_X$ becomes positive, the value of $I_{outn}$ will become $-I_{B3}$, which would result in $I_{outp}=I_{B3}$. Conversely, assuming that the current-mode Schmitt Trigger (101) starts at a low state of $I_{on}=-I_{B2}$ (i.e., $I_{op}=I_{B2}$ and $I_X>0$), the value of $I_{outn}$ will remain at $-I_{B3}$ until $I_X$ becomes negative (i.e., $I_X$ becomes less than $I_{B2}$). As $I_X$ becomes negative, the value of $I_{outn}$ will become $I_{B3}$, which would result in $I_{outp}=-I_{B3}$.

As a result of the above operation, a hysteresis of the current-mode Schmitt Trigger (101) can be changed using only $I_{B2}$ while the balanced output signals ($I_{outn}$ and $I_{outp}$) of the hysteresis control COS (201C) can be independently controlled using only $I_{B3}$. During the above operation, $I_{B1}$ remains unchanged.

Operations of the square wave generator (100) will now be discussed in more detail in reference to FIG. 2B. Firstly, a maximum alternating current (AC) current of the current output signal at the output amplitude control stage non-inverting output ($I_{op}$) and output amplitude control stage inverting output ($I_{on}$) is equal to the second biasing current ($I_{B2}$). For example, assuming that the output current at the output amplitude control stage non-inverting output ($I_{op}$) starts at $I_F=I_{op}=-I_{B2}$ (i.e., the input current signal ($I_X$)<0), the current output signal at output amplitude control stage inverting output ($I_{on}$) (i.e., square wave output ($I_{out}$)) will remain at the second biasing current ($I_{B2}$) until the feedback current ($I_R$) becomes larger than the second biasing current ($I_{B2}$) where input current signal ($I_X$) is now positive. As a result, $I_{on}$ will change to $-I_{B2}$. As another example, assuming that the Schmitt Trigger (101) is in a low state of $I_{on}=-I_{B2}$ (i.e., $I_{op}=I_{B2}$ and $I_X>0$), $I_{on}$ will remain in this state (i.e., $-I_{B2}$) until $I_R$ becomes less than $-I_{B2}$, at which $I_X$ will become negative and $I_{on}$ will become positive (i.e., $I_{on}=I_{B2}$).

Furthermore, expressions for a voltage of the capacitor (103) and the feedback resistor current ($I_R$) of the resistor (105) can be observed during a charging interval of $I_{outn}$=the third biasing current ($I_{B3}$) (i.e., $I_X>0$ and $I_F=-I_{B2}$). Such observations result in the following Equation (1) for a charging and discharging interval of the square wave generator (100):

$$T_{Charge} = T_{Discharge} = RCln\left(\frac{I_{B3}+I_{B2}}{I_{B3}-I_{B2}}\right) \qquad \text{Equation (1)}$$

Using Equation (1), a frequency of an oscillation of the square wave output ($I_{out}$) can be derived as following Equation (2):

$$f_{osc} = \frac{1}{\left[2RCln\left(\frac{IB_3 + IB_2}{IB_3 - IB_2}\right)\right]} \quad \text{Equation (2)}$$

Above Equation (2) shows that the frequency of the oscillation of the square wave output ($I_{out}$) is virtually independent of the supply voltages ($V_{DD}$, $V_{SS}$). Additionally, Equation (2) also shows that the frequency of the oscillation of the square wave output ($I_{out}$) may be controlled using the third biasing current ($I_{B3}$) (while using $I_{B3} > I_{B2}$) without changing an amplitude of oscillation of the second biasing current ($I_{B2}$). This advantageously results in a square wave output having an output amplitude and variable frequency of oscillation that are independent of the supply voltage and transistor parameters of the square wave generator (100) circuit.

Figure 3:
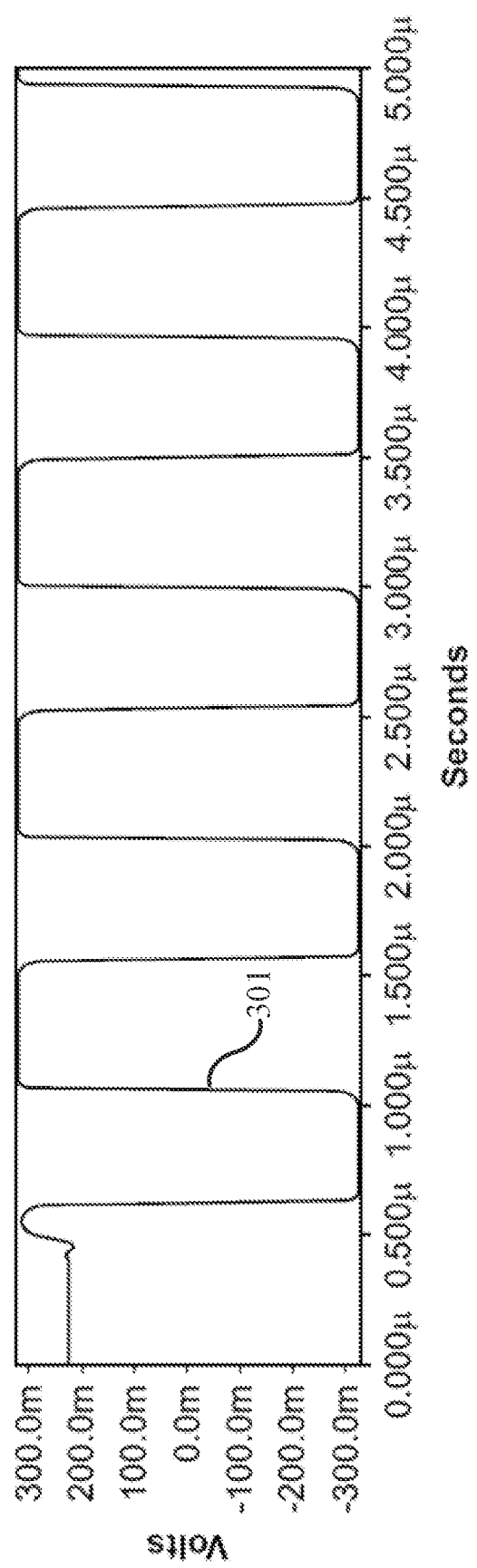
FIG. 3 shows a graph in accordance with one or more embodiments.

FIG. 3 shows an example square wave output ($I_{out}$) generated by the square wave generator (100) of one or more embodiments. The square wave output ($I_{out}$) in FIG. 3 is generated using a 90 nm CMOS simulation process. During the simulation: a supply voltage of ±0.5V is set for $V_{DD}$ and $V_{SS}$; the capacitor (103) is set with a capacitance of 25 picofarads (pF); the resistor (105) is set with a resistance of 40 kiloohms (kΩ); the second biasing current ($I_{B2}$) is fixed to 5 µA; and an oscillation period of the square wave output ($I_{out}$) is tuned by varying the third biasing current ($I_{B3}$).

As shown in FIG. 3, a square wave (301) driving a load resistance of 100 kΩ is generated using the above simulation conditions. The square wave (301) has a peak-to-peak voltage (Vpp) 0.6Vpp and an oscillation frequency ($f_{osc}$) of 1 MHz. The oscillation frequency ($f_{osc}$) of the square wave (301) is varied by changing a value of the third biasing current ($I_{B3}$).

Figure 4:
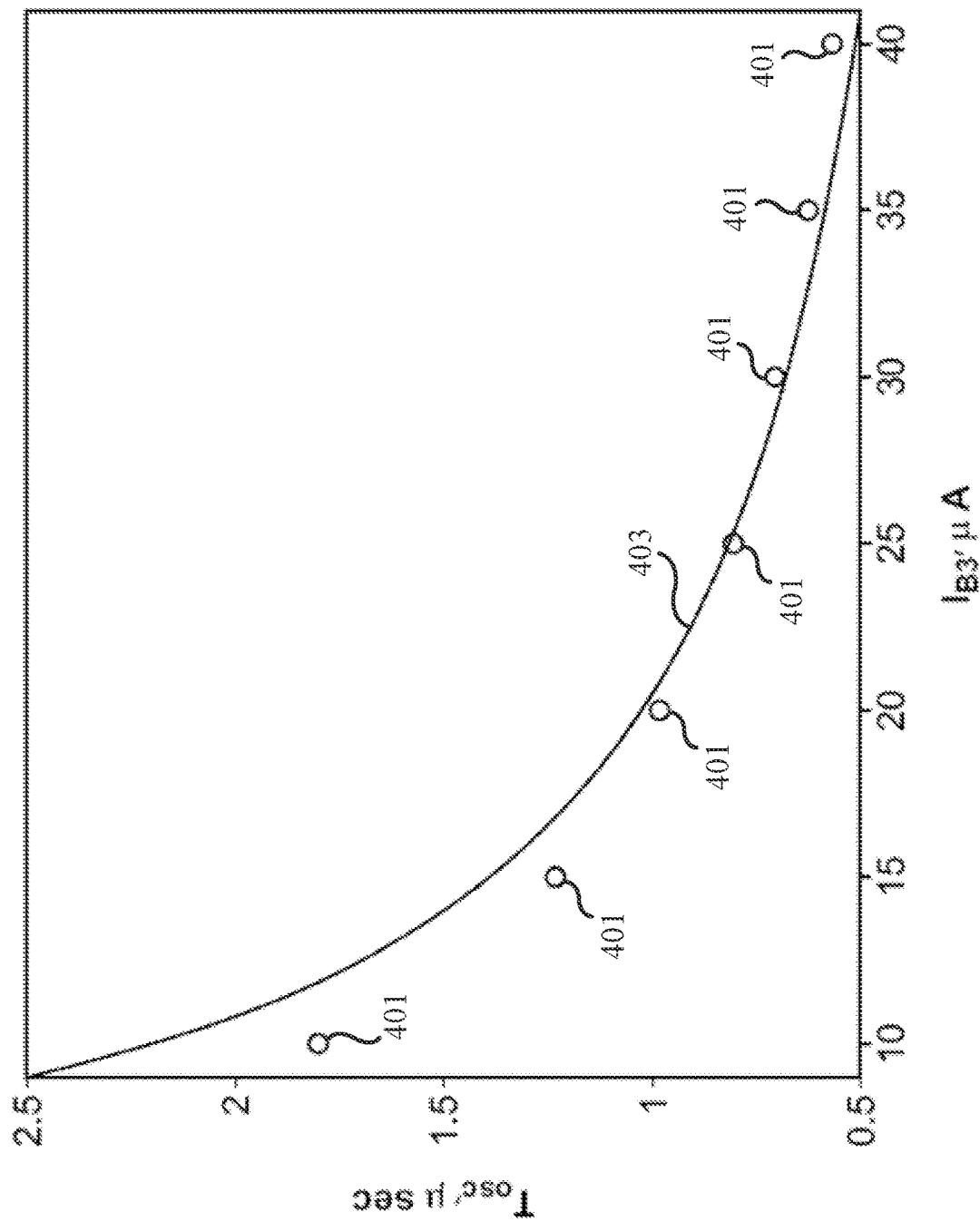
FIG. 4 shows a graph in accordance with one or more embodiments.

FIG. 4 shows a graph of illustrating the effects of varying the third biasing current ($I_{B3}$) on the oscillation frequency ($f_{osc}$) of the square wave (301). As shown in FIG. 4, the third biasing current ($I_{B3}$) is varied between 10 µA to 40 µA at an interval of 5 µA. A respective period of oscillation ($T_{osc}$) (i.e., the inverse of the oscillation frequency ($f_{osc}$)) is recorded for each interval of 5 µA. A regression line (403) is then generated based on each of the periods of oscillation (401) recorded in the graph of FIG. 4. As shown by the regression line (403) the periods of oscillation (401) exponentially decreases as the third biasing current ($I_{B3}$) increases.

Figure 5A:
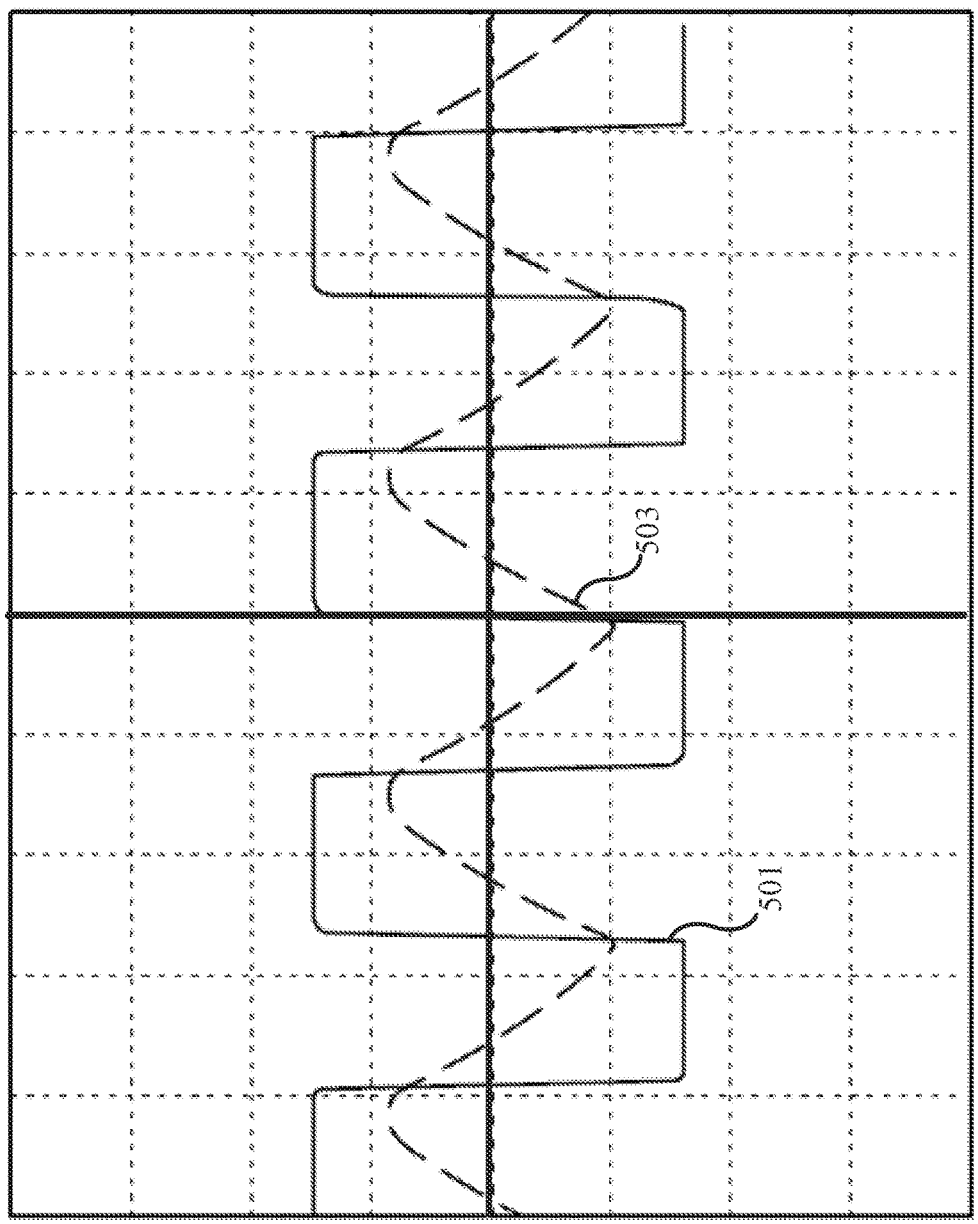
Figure 5C:
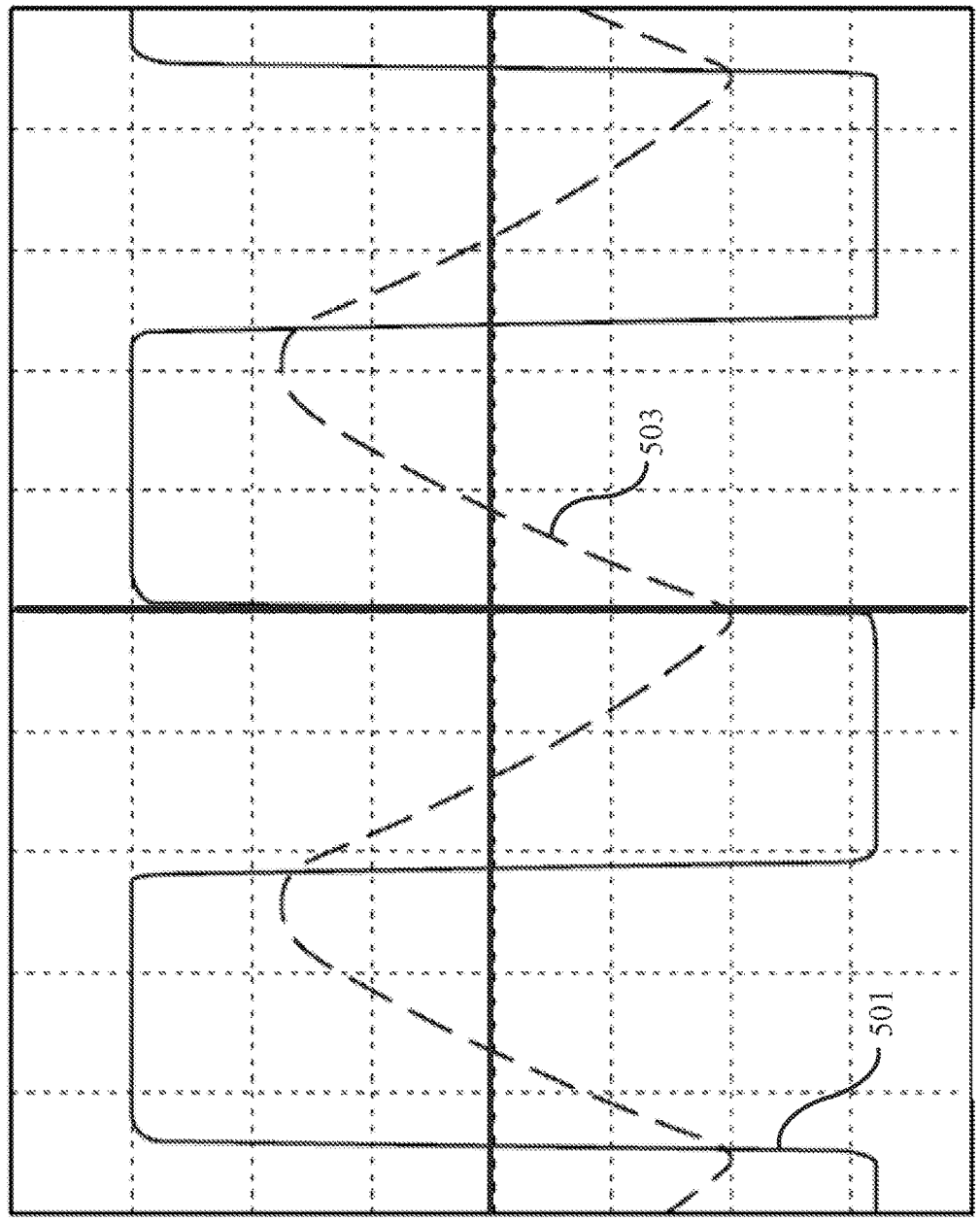

FIGS. 5A-5C show another example of the square wave output ($I_{out}$) generated by the square wave generator (100) of one or more embodiments. The waveforms of FIGS. 5A-5C were captured using a standard oscilloscope. Additionally, the results of FIGS. 5A-5C were reproduced based on the following conditions applied to the square wave generator (100): supply voltage of ±3V; second biasing current ($I_{B2}$) of 15 µA; resistor (105) with a resistance of 10 kΩ; and capacitor (103) with a capacitance of 10.7 µF. In FIGS. 5A-5C, a voltage (503) of the capacitor (103) is also shown along with the square wave output ($I_{out}$) (501). The oscillation frequency ($f_{osc}$) set in FIGS. 5A-5C are 7.53 kHz, 5.61 kHz, and 4.48 kHz, respectively, and varied by changing a value of the third biasing current ($I_{B3}$) to 50 µA, 38 µA, and 31 µA, respectively.

Embodiments of the present disclosure may provide at least one of the following advantages leading to improvements over conventional square wave oscillators: an output amplitude and frequency of oscillation of the square wave output is independent of the supply voltage and transistor parameters of the square wave generator (100) circuit; utilizes a simple CMOS structure requiring less passive components (e.g., resistors) (e.g., only one resistor is required in the entire circuit); the frequency of oscillation can be tuned using a biasing current of the square wave generator (100) circuit; improved compatibility with low power and low voltage devices and applications compared to square wave generators using non-CMOS based technology; etc. Details about each of these advantages are discussed above in reference to FIGS. 1-5B.

Additionally, applications for the square wave generator (100) of one or more embodiments include (but not limited to): implantable radio-frequency (RF) transceivers with a frequency of 2 MHz; interface circuit for resistive bridge sensors with a center frequency of 1.177 MHz; and bio-Impedance measurement with a frequency of 20 kHz. For bio-Impedance measurement applications, current-mode oscillators (i.e., current-mode square wave generators) are the natural choice because the output wave form must be current signals. Typical bio-Impedance measurement applications include (but are not limited to): body composition analysis; heart rate extraction; cardiac monitoring; and early diagnosis of cancer. In particular, for the bio-impedance measurement, an AC current should be supplied to a target tissue. Furthermore, classical advantages of square wave generators over their sinusoidal counterparts are low power consumption and low area. In particular, the square wave generator (100) of one or more embodiments may also be used as a normal clock or to control the ON/OFF operation of different blocks in a system, which has been a widespread trend in integrated circuit applications such as bio-medical, industrial, and environmental monitoring. For example, in industry, the square wave generator (100) may be used as wake-up circuits for sensors of chemical and gas monitoring. This is because power consumption is one of the most significant factors in the efficiency of battery operated devices, which require circuits used in such devices to consume very low power. In particular, the power consumption of a timer circuit should be less than the controlled parts in idle state.

The square wave generator (100) may also be used in the implementation of digital delta-sigma modulator and pulse width modulation (PWM) used to implement DC-DC converters, and in the wireless gas sensor applications. Even further, the square wave generator (100) is a good candidate to be adopted in the implementation of digital geophones. In particular, low noise performance is crucial for digital geophones, which are used in seismology to record the energy waves reflected by the subsurface geology. Therefore, the sensor readout circuit will include a chopper amplifier to reduce imperfections of an op-amp (in particular, the 1/f noise and DC offset). In particular, the chopper amplifier will use modulations to transpose the desired signal to a higher frequency where there is less 1/f noise and then demodulation to translate the desired signal back to base-band but after amplification.

As another example, the square wave generator (100) may be used in Analog Digitizer Units (ADUs) for geophone systems that measure seismic data measurement in the oil and gas industry. In particular, the square wave output of the square wave generator (100) may be used as clocks in the ADUs. Additionally, ADUs in geophone systems are known for their high power consumption, and low power ADUs are being designed to overcome the high power consumption requirement of these ADUs. The low voltage low power advantage of the square wave generator (100) of one or more embodiments enables the square wave generator (100) to have good compatibility with new low power ADUs.

While the disclosure has been described with respect to a limited number of embodiments, those skilled in the art, having benefit of this disclosure, will appreciate that other embodiments can be devised which do not depart from the scope of the disclosure as disclosed herein. Accordingly, the scope of the disclosure should be limited only by the attached claims.

Furthermore, although the preceding description has been described herein with reference to particular means, materials and embodiments, it is not intended to be limited to the particulars disclosed herein; rather, it extends to all functionally equivalent structures, methods and uses, such as are within the scope of the appended claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112(f) for any limitations of any of the claims herein, except for those in which the claim expressly uses the words 'means for' together with an associated function.

What is claimed:

1. A square wave oscillator comprising:
   a Schmitt Trigger with a first output that outputs a first output current;
   a capacitor connected to the first output of the Schmitt Trigger; and
   a resistor that connects the capacitor to an input of the Schmitt Trigger to form a closed-loop negative feedback that:
      sustains an oscillation of the square wave oscillator; and
      causes a frequency and an amplitude of the oscillation to be independent of a supply voltage of the Schmitt Trigger,
   wherein an entirety of the square wave oscillator includes only a single resistor.

2. The square wave oscillator of claim 1, wherein
   the Schmitt Trigger further comprises a second output that outputs a second output current and a third output that outputs a third output current and forms a positive feedback loop with the input,
   the second output current is an inverse of the third output current, and
   the second output current is a square wave output of the square wave oscillator.

3. The square wave oscillator of claim 1, wherein the oscillation is controlled using a biasing current of the Schmitt Trigger.

4. The square wave oscillator of claim 1, wherein
   the Schmitt Trigger further comprises a third output that outputs a third output current, and
   the square wave oscillator further comprises a positive feedback loop that feeds the third output current into the input of the Schmitt Trigger and
   the positive feedback loop is a regeneration feedback loop of the Schmitt Trigger.

5. The square wave oscillator of claim 4, wherein the third output is a non-inverting output of the Schmitt Trigger.

6. The square wave oscillator of claim 1, wherein the resistor converts a voltage of the capacitor into a current.

7. The square wave oscillator of claim 1, wherein the Schmitt Trigger includes:
   a plurality of current output stages; and
   each of the current output stages include a plurality of complementary metal-oxide-semiconductors (CMOS).

8. The square wave oscillator of claim 7, wherein the frequency and the amplitude of the oscillation are independent of a parameter of the CMOSs of the Schmitt Trigger.

9. The square wave oscillator of claim 7, wherein the first output is an inverting output of one stage among the plurality of current output stages.

10. The square wave oscillator of claim 7, wherein the plurality of current output stages include:
    an input stage;
    a hysteresis control stage; and
    an output amplitude control stage.

11. The square wave oscillator of claim 10, wherein
    the first output is an inverting output of the amplitude control stage, and
    the oscillation is controlled using a biasing current of the amplitude control stage.

12. The square wave oscillator of claim 10, wherein the frequency of the oscillation is defined by:

$$f_{osc} = \frac{1}{\left[2RC\ln\left(\frac{IB_3 + IB_2}{IB_3 - IB_2}\right)\right]}$$

wherein $f_{osc}$ is the frequency of the oscillation, R is a resistance of the resistor, C is a capacitance of the capacitor, $I_{B2}$ is a biasing current of the hysteresis control stage, and $I_{B3}$ is a biasing current of the output amplitude control stage.

13. The square wave oscillator of claim 12, wherein the frequency of the oscillation is controlled using the biasing current of the output amplitude control stage.

14. The square wave oscillator of claim 13, wherein the frequency of the oscillation changes exponentially as a value of the biasing current of the output amplitude control stage is varied.

15. The square wave oscillator of claim 7, wherein each of the plurality of current output stages includes a biasing current.

* * * * *